(12) United States Patent
Ellä

(10) Patent No.: US 6,741,146 B2
(45) Date of Patent: May 25, 2004

(54) FILTER STRUCTURE COMPRISING PIEZOELECTRIC RESONATORS

(75) Inventor: Juha Ellä, Halikko (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/225,490

(22) Filed: Aug. 21, 2002

(65) Prior Publication Data

US 2003/0042995 A1 Mar. 6, 2003

(30) Foreign Application Priority Data

Aug. 21, 2001 (FI) .............................. 20011678

(51) Int. Cl.⁷ ................................ H03H 9/00
(52) U.S. Cl. ....................... 333/133; 333/187; 333/189; 333/190
(58) Field of Search .................. 333/133, 189, 333/119, 187, 192, 190, 191, 112, 125, 193; 310/320

(56) References Cited

U.S. PATENT DOCUMENTS

| | | | |
|---|---|---|---|
| 5,294,898 A | * 3/1994 | Dworsky et al. | 333/187 |
| 5,697,087 A | * 12/1997 | Miya et al. | 455/307 |
| 5,839,062 A | * 11/1998 | Nguyen et al. | 455/323 |
| 5,874,866 A | * 2/1999 | Satoh et al. | 331/107 A |
| 5,942,958 A | * 8/1999 | Lakin | 333/189 |
| 6,242,843 B1 | * 6/2001 | Pohjonen et al. | 310/313 R |
| 6,262,637 B1 | * 7/2001 | Bradley et al. | 333/133 |
| 2002/0093394 A1 | * 7/2002 | Tikka et al. | 333/133 |

FOREIGN PATENT DOCUMENTS

WO 0130090 4/2001

OTHER PUBLICATIONS

First Page—Windows, Document: JP2000315936.
"Acoustic bulk wave composite resonators" by K.M. Lakin et al Applied Physics Letters, vol. 38, No. 3, pp. 125–127, Feb. 1, 1981.
"An Air–Gap Type Piezoelectric Composite Thin Film Resonator" by H. Satoh et al, 15 Proc. 39th Annual Symp. Freq. Control, pp. 361–366, 1985.
U.S. patent application Publication No. 2003/0009576 A1 Publication Date: Jan. 9, 2003.
3GPP TS 26.233 V5.0.0 (Mar. 2002) 3rd Generation Partnership Project; Technical Specification Group Services and System Aspects; Transparent end–to–end packet switched streaming service (PSS); General description (Release 5).

* cited by examiner

*Primary Examiner*—Brian Young
*Assistant Examiner*—John B Nguyen
(74) *Attorney, Agent, or Firm*—Ware, Fressola, Van Der Sluys & Adolphson LLP

(57) ABSTRACT

A filter structure (900, 1300, 1400, 1610) comprises a filter section (900) having at least two branches (901, 902) connected in parallel. A first branch (901) of said at least two branches comprises a first plurality (921, 701) of piezoelectric resonators connected in series, and a second branch (902) of said at least two branches comprises a second plurality (922, 702) of piezoelectric resonators and phase shifting means (910) connected in series. The phase shifting means are arranged to provide a phase shift of substantially 180 degrees.

22 Claims, 12 Drawing Sheets

US 6,741,146 B2

FILTER STRUCTURE COMPRISING PIEZOELECTRIC RESONATORS

FIELD OF THE INVENTION

The invention relates in general to radio frequency filter. In particular it relates to filter structures comprising piezoelectric resonators, typically thin film bulk acoustic wave (BAW) resonators.

BACKGROUND OF THE INVENTION

The development of mobile telecommunications continues towards ever smaller and increasingly complicated handheld units. The development leads to increasing requirements on the miniaturization of the components and structures used in the mobile communication means. This development concerns radio frequency (RF) filter structures as well, which despite the increasing miniaturization should be able to withstand considerable power levels, have very steep passband edges, and low losses.

The RF filters used in prior art mobile phones are usually discrete surface acoustic wave (SAW) or ceramic filters. Surface acoustic wave (SAW) resonators typically have a structure similar to that shown in FIG. 1. Surface acoustic resonators utilize surface acoustic vibration modes of a solid surface, in which modes the vibration is confined to the surface of the solid, decaying quickly away from the surface. A SAW resonator typically comprises a piezoelectric layer 100, and two electrodes 122, 124. These electrodes form an Interdigital Transducer (IDT). The shape of the electrodes 122, 124 typically resembles letter E or a comb, and the electrodes are placed so that the fingers of a first electrode are parallel with the fingers of a second electrode and between them. The frequency of a SAW resonator depends most on the distance between the fingers and also on the width of the fingers. Impedance of a SAW resonator depends mostly on the number of fingers and on the length of the fingers. In addition to the IDT, a SAW resonator has typically two reflectors, one on each side of the IDT, for reflecting back the surface acoustic wave induced by the IDT and traversing in a direction normal to the direction of the fingers of the IDT.

Various resonator structures such as filters are produced with SAW resonators. A SAW resonator has the advantage of having a very small size, but unfortunately a SAW resonator cannot withstand high power levels.

It is known to construct thin film bulk acoustic wave resonators on semiconductor wafers, such as silicon (Si) or gallium arsenide (GaAs) wafers. For example, in an article entitled "Acoustic Bulk Wave Composite Resonators", Applied Physics Letters, Vol. 38, No. 3, pp. 125–127, Feb. 1, 1981, by K. M. Lakin and J. S. Wang, an acoustic bulk wave resonator is disclosed which comprises a thin film piezoelectric layer of zinc oxide (ZnO) sputtered over a thin membrane of silicon (Si). Further, in an article entitled "An Air-Gap Type Piezoelectric Composite Thin Film Resonator", I5 Proc. 39th Annual Symp. Freq. Control, pp. 361–366, 1985, by Hiroaki Satoh, Yasuo Ebata, Hitoshi Suzuki, and Choji Narahara, a bulk acoustic wave resonator having a bridge structure is disclosed.

FIG. 2 shows one example of a bulk acoustic wave resonator having a bridge structure. The structure comprises a membrane 130 deposited on a substrate 200. The resonator further comprises a bottom electrode 110 on the membrane, a piezoelectric layer 100, and a top electrode 120. A gap 210 is created between the membrane and the substrate by etching away some of the substrate from the top side. The gap serves as an acoustic isolator, essentially isolating the vibrating resonator structure from the substrate.

In the following, certain types of BAW resonators are first described. Bulk acoustic wave resonators are typically fabricated on silicon (Si), gallium arsenide (GaAs), glass, or ceramic substrates. One further ceramic substrate type used is alumina. The BAW devices are typically manufactured using various thin film manufacturing techniques, such as for example sputtering, vacuum evaporation or chemical vapor deposition. BAW devices utilize a piezoelectric thin film layer for generating the acoustic bulk waves. The resonance frequencies of typical BAW devices range from 0.5 GHz to 5 GHz, depending on the size and materials of the device. BAW resonators exhibit the typical series and parallel resonances of crystal resonators. The resonance frequencies are determined mainly by the material of the resonator and the dimensions of the layers of the resonator.

A typical BAW resonator consists of three basic elements:
an acoustically active piezoelectric layer,
electrodes on opposite sides of the piezoelectric layer, and
acoustical isolation from the substrate.

The piezoelectric layer may be for example, ZnO, AlN, ZnS or any other piezoelectric material that can be fabricated as a thin film. As a further example, also ferroelectric ceramics can be used as the piezoelectric material. For example, $PbTiO_3$ and $Pb(Zr_xTi_{1-x})O_3$ and other members of the so called lead lanthanum zirconate titanate family can be used.

The material used to form the electrode layers is an electrically conductive material. The electrodes may be comprised of for example any suitable metal, such as tungsten (W), aluminum (Al), copper (Cu), molybdenum (Mo), nickel (Ni), titanium (Ti), niobium (Nb), silver (Ag), gold (Au), and tantalum (Ta). The substrate is typically composed of for example Si, $SiO_2$, GaAs, glass, or ceramic materials.

The acoustical isolation can be produced with for example the following techniques:
with a substrate via-hole,
with a micromechanical bridge structure, or
with an acoustic mirror structure.

In the via-hole and bridge structures, the acoustically reflecting surfaces are the air interfaces below and above the devices. The bridge structure is typically manufactured using a sacrificial layer, which is etched away to produce a free-standing structure. Use of a sacrificial layer makes it possible to use a wide variety of substrate materials, since the substrate does not need to be modified very much, as in the via-hole structure. A bridge structure can also be produced using an etch pit structure, in which case a pit has to be etched in the substrate or the material layer below the BAW resonator in order to produce the free standing bridge structure.

FIG. 3 illustrates one example of various ways of producing a bridge structure. Before the deposition of other layers of the BAW structure, a sacrificial layer 135 is deposited and patterned first. The rest of the BAW structure is deposited and patterned partly on top of the sacrificial layer 135. After the rest of the BAW structure is completed, the sacrificial layer 135 is etched away. FIG. 3 shows also the substrate 200, a membrane layer 130, the bottom electrode 110, the piezoelectric layer 100, and the top electrode 120. The sacrificial layer can be realized using for example ceramic, metallic or polymeric material.

In the via-hole structure, the resonator is acoustically isolated from the substrate by etching away the substrate from under a major portion of the BAW resonator structure. FIG. 4 shows a via-hole structure of a BAW resonator. FIG. 4 shows the substrate 200, a membrane layer 130, the bottom electrode 110, the piezoelectric layer 100, and the top electrode 120. A via-hole 211 has been etched through the whole substrate. Due to the etching required, via-hole structures are commonly realized only with Si or GaAs substrates.

A further way to isolate a BAW resonator from the substrate is by using an acoustical mirror structure. The acoustical mirror structure performs the isolation by reflecting the acoustic wave back to the resonator structure. An acoustical mirror typically comprises several layers having a thickness of one quarter wavelength at the center frequency, alternating layers having differing acoustical impedances. The number of layers in an acoustic mirror is typically ranging from three to nine. The ratio of acoustic impedance of two consecutive layers should be large in order to present as low acoustic impedance as possible to the BAW resonator, instead of the relatively high impedance of the substrate material. In the case of a piezoelectric layer that is one quarter of the wavelength thick, the mirror layers are chosen so that as high acoustic impedance as possible is presented to the resonator. This is disclosed in U.S. Pat. No. 5,373,268. The material of the high impedance layers can be for example gold (Au), molybdenum (Mo), or tungsten (W), and the material of the low impedance layers can be for example silicon (Si), polysilicon (poly-Si), silicon dioxide ($SiO_2$), aluminum (Al), or a polymer. Since in structures utilizing an acoustical mirror structure, the resonator is isolated from the substrate and the substrate is not modified very much, a wide variety of materials can be used as a substrate. The polymer layer may be comprised of any polymer material having a low loss characteristic and a low acoustic impedance. Preferably, the polymer material is such that it can withstand temperatures of at least 350° C., since relatively high temperatures may be needed during deposition of other layers of the acoustical mirror structure and other structures. The polymer layer may be comprised of, by example, polyimide, cyclotene, a carbon-based material, a silicon-based material or any other suitable material.

FIG. 5 shows an example of a BAW resonator on top of an acoustical mirror structure. FIG. 5 shows the substrate 200, the bottom electrode 110, the piezoelectric layer 100, and the top electrode 120. The acoustical mirror structure 150 comprises in this example three layers 150a, 150b. Two of the layers 150a are formed of a first material, and the third layer 150b in between the two layers is formed from a second material. The first and second materials have different acoustical impedances as described previously. The order of the materials can be varied. For example, the material with a high acoustical impedance can be in the middle and the material with a low acoustical impedance on both sides of the middle material, or vice versa. The bottom electrode may also be used as one layer of the acoustical mirror.

FIG. 6 shows a further example of a BAW resonator structure. The BAW resonator illustrated in FIG. 6 is a stacked resonator structure having two piezoelectric layers 100. In addition to the bottom 110 and top 120 electrodes, a stacked structure requires a middle electrode 115, which is connected to ground potential. FIG. 6 further shows the membrane layer 130, the substrate 200 and the etch pit 210 isolating the structure from the substrate.

Radio frequency filters, for example, may be constructed using piezoelectric resonators. The resonance frequencies of SAW resonators and of thin film BAW resonators are such that it is advantageous to use them in filters, which are designed to operate at a certain frequency band at a frequency range from about 1 GHz to a few GHz. FIG. 7a presents, as an example, a ladder filter 700 having three similar ladder sections 710, each ladder section 710 consisting of a resonator 701 connected in series and of a second resonator 702 connected in parallel. The series resonance frequency $f_{ss}$ of the series resonator 701 and the parallel frequency $f_{pp}$ of the shunt resonator 702 are typically at or close to the center frequency of the ladder filter 700. When a filter is constructed using BAW resonators, the difference in the resonance frequencies of the series resonators 701 and shunt resonators 702 is typically achieved by adding a thin layer of material to the shunt resonators 702. This additional layer increases the resonator thickness and decreases the resonance frequency.

A ladder filter is typically constructed by connecting a certain number of ladder filter sections 710 in series, for achieving the desired characteristics of the filter. Ladder filters typically exhibit fairly good performance in the pass band, but achieving good out-of-band attenuation requires many filter stages, that is ladder sections connected in series. Mobile telephony applications, for example, typically require at least three stages in a ladder filter to achieve desired out-of-band attenuation. FIG. 7b illustrates electric response of one particular ladder filter having the structure specified in FIG. 7a, where the resonators are BAW resonators and the series resonance frequency $f_{ss}$ of the series resonator 701 is close to the parallel resonance frequency $f_{pp}$ of the shunt resonator 702. The electric responses in FIG. 7b are calculated. The lower curve corresponds to a ladder filter, where the capacitance (or area) of a shunt resonator is twice that of a series resonator; i.e. the ratio of capacitances of the shunt and series resonators is 2. The upper curve corresponds to a ladder filter, where the capacitances (areas) of the series and shunt resonators are equal, i.e. the ratio is 1.

FIG. 8a presents an example of a lattice filter structure 800 having two lattice sections 810 connected in series; in each lattice section 810 resonators 801a and 801b have a higher resonance frequency than resonators 802a and 802b Lattice filters typically exhibit good out-of-band attenuation far from the pass band, but attenuation near the pass band is not very good. To obtain desired attenuation near pass band, lattice filters typically have a number of lattice sections connected in series. FIG. 8b illustrates electric response of one particular two-stage lattice filter, that is a filter having the structure specified in FIG. 8a. Furthermore, the series and shunt BAW resonators of the lattice filter, whose calculated electric response is illustrated in FIG. 8b, have equal capacitances (areas). The BAW resonators 701, 702 of that ladder filter 700 and BAW resonators 801, 802 of that lattice filter 800, whose electrical responses are presented in FIGS. 7b (upper curve) and 8b, are identical and the parallel resonance frequency $f_{pp}$ of the resonators 702/802 is close to the series resonance frequency $f_{ss}$ of the resonators 701/801. FIGS. 7b and 8b clearly demonstrate that the attenuation near the pass band is much better in a ladder filter and the attenuation far from the pass band is much better in a lattice filter. If it is desired to have similar attenuation notches close to the pass band edge (i.e. above and below the passband), as in the case of a ladder filter, then the resonators of a lattice filter, should have an area ratio of less than one (that is, the area of the resonators whose series resonance is close to center frequency should have the larger area), which in turn decreases the out-of-band attenuation far from the passband. This phenomenon is discussed, for example, in patent applications EP1017170 and FI982824. One problem in using ladder filters and lattice filters is that a number of ladder sections or lattice sections are required to achieve good out-of-band attenuation. Such filters having many filter sections have quite a number of piezoelectric resonators. Lattice filters, which have a symmetric structure, furthermore require balanced input and output ports. An antenna typically provides an unbalanced output. Therefore, when a lattice filter is used in current mobile telephony applications, arranging a balanced input requires further components and typically causes further losses.

A further problem with ladder filters is that they have a fairly limited range of relative bandwidths. The maximum bandwidth is limited by the coupling coefficient of the piezoelectric material used in the piezoelectric resonators. The bandwidth of a ladder filter may be decreased by under-tuning BAW resonators, but the response starts to degrade fairly soon, as the standing wave ratio becomes large and insertion loss increases. In an optimal ladder filter, the parallel resonance frequency $f_{pp}$ of a shunt resonator is equal to the series resonance frequency $f_{ss}$ of a series resonator. If it is desired to widen the pass band, frequency $f_{pp}$ is decreased and/or frequency $f_{ss}$ is increased; this typically, however, causes the dent in the middle of the electric response to deepen. Alternatively, it is possible to decrease the pass band by cross-tuning the series and shunt resonators, i.e. to decrease frequency $f_{ss}$ and/or to increase frequency $f_{pp}$. Also in this case, the electric response typically degrades.

SUMMARY OF THE INVENTION

An object of the invention is to present a filter structure having unbalanced input and output ports and enabling good in-band and out-of-band characteristics. A further object of the invention is to present a filter structure having a moderate number of components.

Objects of the invention are achieved with a novel filter section forming either a filter structure or a part of a filter structure.

A filter structure according to the invention comprises a filter section having at least two branches connected in parallel, first branch of said at least two branches comprising a first plurality of piezoelectric resonators connected in series and a second branch of said at least two branches comprising a second plurality of piezoelectric resonators and phase shifting means connected in series, said phase shifting means arranged to provide a phase shift of substantially 180 degrees and piezoelectric resonators belonging to said second plurality having a second resonance frequency, said second resonance frequency being different from the first resonance frequency.

In another aspect of the invention, an arrangement for transmitting and receiving radio frequency signal comprises first amplification means for amplifying a first signal, second amplification means for amplifying a second signal, and a filter structure comprising a first filter branch for filtering the first signal and a second filter branch for filtering the second signal, said first filter branch having a first input conductor and a first output conductor and said second filter branch having a second input conductor and a second output conductor, said first output conductor being connected to said second input conductor, said first input conductor being coupled to an output of the first amplification means and said second output conductor being coupled to an input of the second amplification means, and at least one of said first and second filter branches comprising a filter section having at least two branches connected in parallel, first branch of said at least two branches comprising a first plurality of piezoelectric resonators connected in series, piezoelectric resonators belonging to said first plurality having a first resonance frequency, and a second branch of said at least two branches comprising a second plurality of piezoelectric resonators and phase shifting means connected in series, said phase shifting means arranged to provide a phase shift of substantially 180 degrees and piezoelectric resonators belonging to said second plurality having a second resonance frequency, said second resonance frequency being different from the first resonance frequency.

In a further aspect of the invention, an arrangement for transmitting radio frequency signal comprises a single-ended filter structure providing a port for coupling thereto an antenna, and amplification means connected to said filter structure for amplifying a signal to be transmitted before filtering said signal, and said filter structure comprising a filter section having at least two branches connected in parallel, first branch of said at least two branches comprising a first plurality of piezoelectric resonators connected in series, piezoelectric resonators belonging to said first plurality having a first resonance frequency, and a second branch of said at least two branches comprising a second plurality of piezoelectric resonators and phase shifting means connected in series, said phase shifting means arranged to provide a phase shift of substantially 180 degrees and piezoelectric resonators belonging to said second plurality having a second resonance frequency, said second resonance frequency being different from the first resonance frequency.

In a further aspect of the invention, an arrangement for receiving radio frequency signal comprises a filter structure providing a port for coupling thereto an antenna, and amplification means connected to said filter structure for amplifying a filtered signal, and said filter structure comprising a filter section having at least two branches connected in parallel, first branch of said at least two branches comprising a first plurality of piezoelectric resonators connected in series, piezoelectric resonators belonging to said first plurality having a first resonance frequency, and a second branch of said at least two branches comprising a second plurality of piezoelectric resonators and phase shifting means connected in series, said phase shifting means arranged to provide a phase shift of substantially 180 degrees and piezoelectric resonators belonging to said second plurality having a second resonance frequency, said second resonance frequency being different from the first resonance frequency.

The accompanying dependent claims describe some preferred embodiments of the invention.

A filter section having at least two parallel branches is described here. A first branch of the filter section has a plurality of piezoelectric resonators connected in series. The number of resonators in this plurality is at least one. A second branch of the filter section has a plurality of piezoelectric resonators and phase shifting means providing a phase shift of substantially 180 degrees connected in series. The number of resonators in this second plurality is also at least one. Typically the branches have no further components, so that the first branch consists of the first plurality of piezoelectric resonators connected in series and the second branch consists of the second plurality of piezoelectric resonators and phase shifting means connected in series. The most simple filter section according to this invention thus comprises two piezoelectric resonators—one series resonator and one shunt resonator—and suitable phase shifting means connected in series with the shunt resonator.

The piezoelectric resonators may be bulk acoustic wave resonators having, for example, any structure described above. They may alternatively be surface acoustic wave resonators.

The electrical response of a filter section having the specified structure is practically similar to that of a lattice filter section having similar piezoelectric resonators, but the number of resonators is half of the number of resonators in a lattice filter section. Therefore the specified filter section is hereafter in this description called a half-lattice filter section. The number of components in a filter required to produce a desired electric response may thus be decreased significantly using a half-lattice filter section. This is one advantage of the invention. Furthermore, the half-lattice filter section is single ended and it may easily be used, for example, in mobile telephony applications.

It is also possible to combine the half-lattice filter section with, for example, ladder filter section(s). This way it is possible to design and construct single-ended filters, which have a moderate number of components, to meet the needs of various applications. The electric response of such a filter typically has the good out-of-band properties of a lattice filter, steep transitions from pass band to stop band similar to those of ladder filter and the good in-band properties of a ladder and lattice filter. In addition, a wider range of useful relative bandwidths may be available.

Some examples, where a filter structure according to the invention may be used, are radio transmitters, receivers and transceivers (especially mobile telephones). A half-lattice filter section according to the invention may form a part of a duplex filter used in a transceiver; both the receiver and transmitter branch of such a duplex filter may comprise half-lattice filter sections.

BRIEF DESCRIPTION OF THE DRAWINGS

The invention will now be described more in detail with reference to the preferred embodiments by the way of example and to the accompanying drawings where.

DETAILED DESCRIPTION OF PREFERRED EMBODIMENTS OF THE INVENTION

Figure 1:
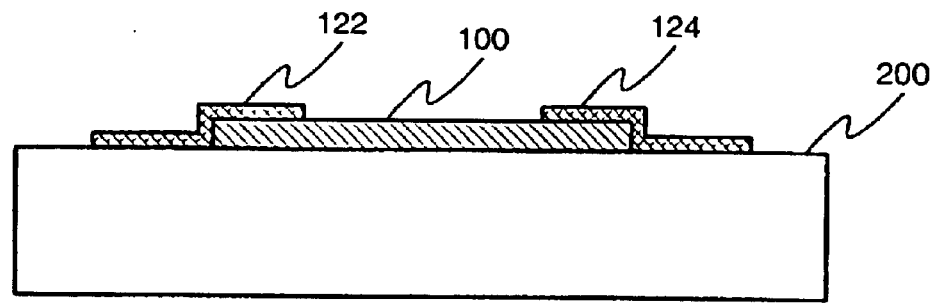
FIG. 1 illustrates a surface acoustic resonator according to prior art.
Figure 2:
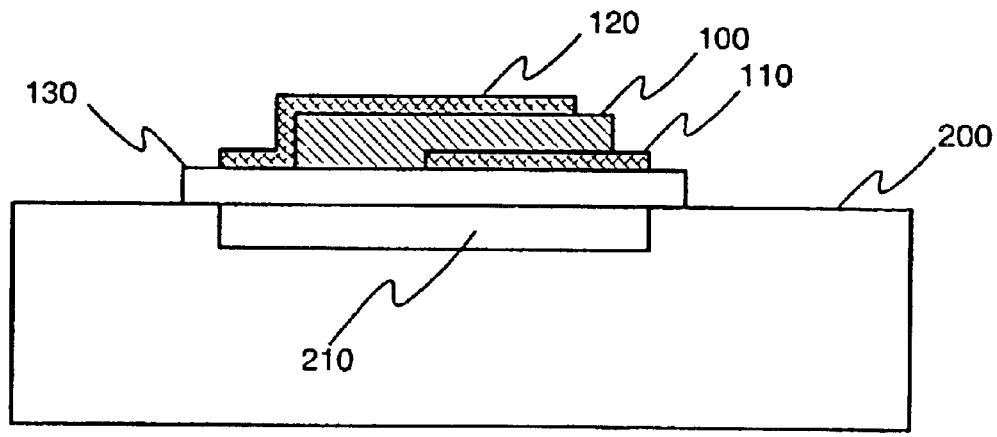
FIG. 2 illustrates a bulk acoustic wave resonator according to prior art.
Figure 3:
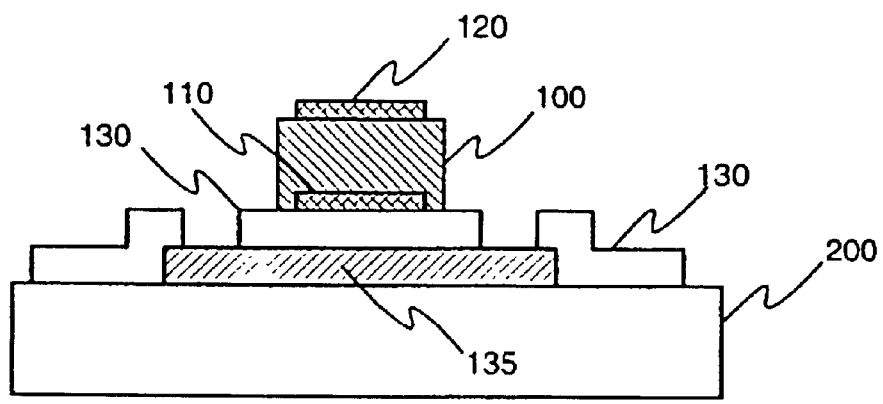
FIG. 3 shows another bulk acoustic wave resonator structure having a bridge structure.
Figure 4:
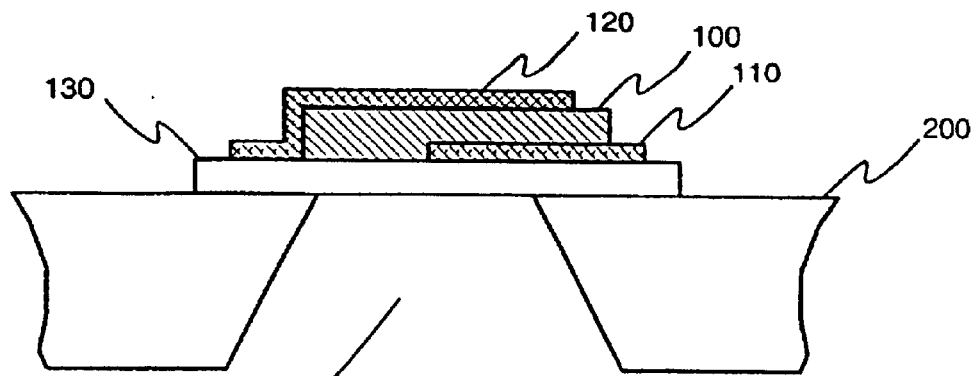
FIG. 4 illustrates a bulk acoustic wave resonator having a via-hole structure.
Figure 5:
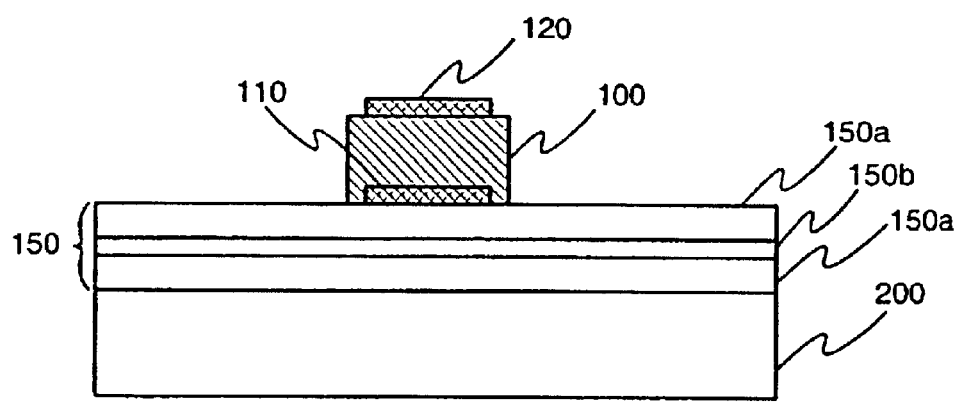
FIG. 5 illustrates a bulk acoustic wave resonator isolated from the substrate by an acoustic mirror structure.
Figure 6:
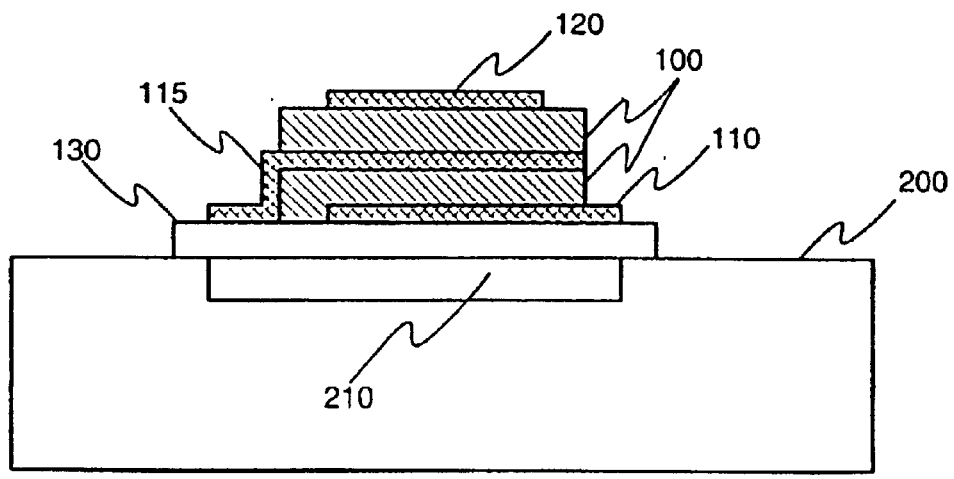
FIG. 6 illustrates a stacked bulk acoustic wave resonator.
Figure 8A:
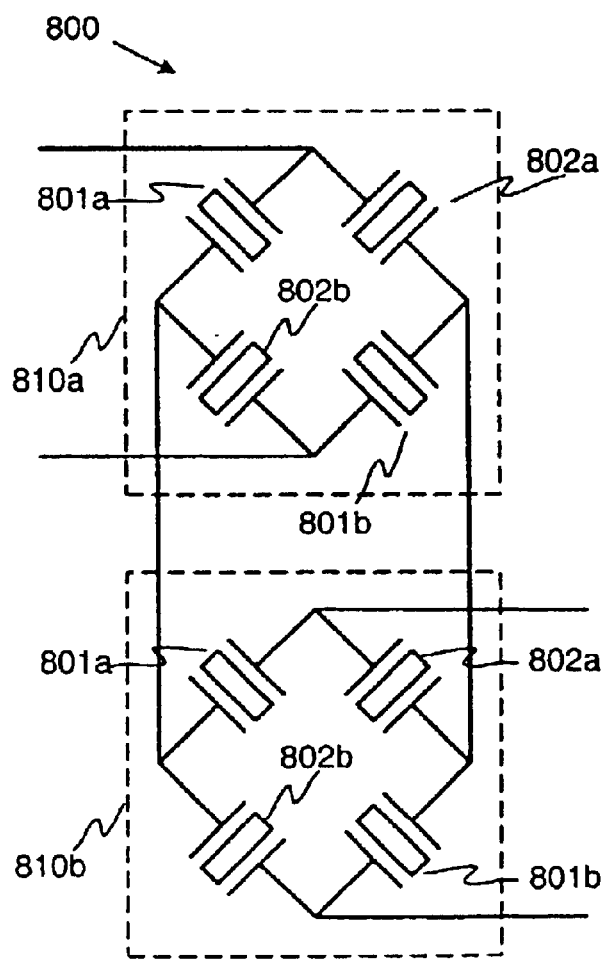
FIG. 8 illustrates an example of a prior art lattice filter structure and its electric response.

Above in conjunction with the description of the prior art reference was made to FIGS. 1–8. The same reference numerals are used for corresponding parts in the figures.

Figure 9:
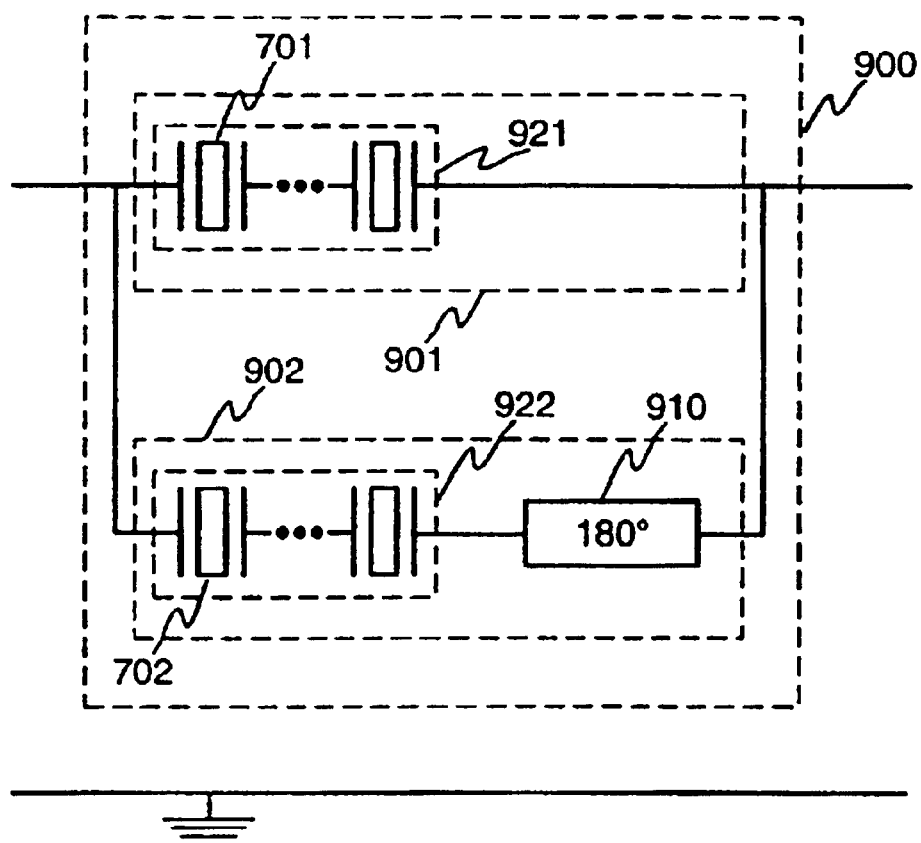
FIG. 9 illustrates an example of a half-lattice filter section according to the invention.

FIG. 9 illustrates a half-lattice filter section 900, where there is a first branch 901 having a first plurality 921 of piezoelectric resonators connected in series. There further is, connected in parallel with this first branch 901, a second branch 902 having a second plurality 922 of piezoelectric resonators and phase shifting means 910 providing a substantially 180 degree phase shift connected in series. The piezoelectric resonators 701 belonging to the first plurality 921 typically have a series resonance frequency near the center frequency of the half-lattice filter section, and the piezoelectric resonators 702 belonging to the second plurality 922 have a parallel resonance frequency near the center frequency of the half lattice filter section. Typically the number of piezoelectric resonators in pluralities 921, 922 is one, but more than one piezoelectric resonators connected in series may be advantageous in some applications. The phase shift provided by phase shifting means 910 is advantageously 180 degrees, but depending, for example, on the impedance level and on the desired width of the pass band of a filter, a phase shift close to 180 degrees is applicable. Typically the phase shift provided by phase shifting means 910 is between 150 and 210 degrees. This phase shift may be realized in various ways known to those skilled in the art. Some preferred embodiments are presented below.

Figure 10A:
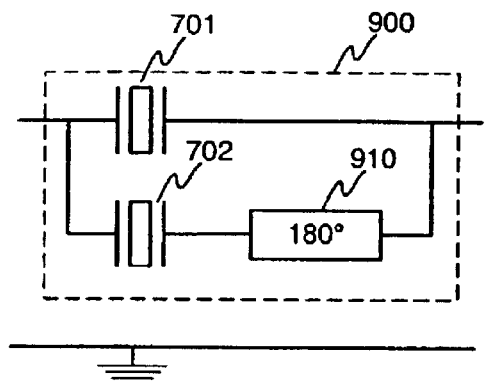
FIG. 10 illustrates some examples of basic half-lattice filter sections according to the invention.
Figure 10B:
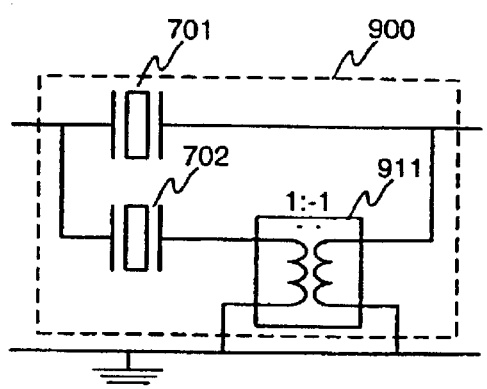
Figure 10C:
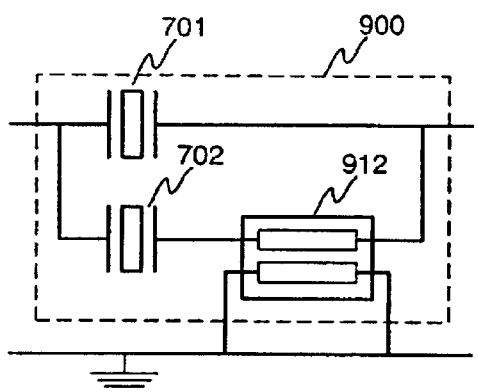
Figure 10D:
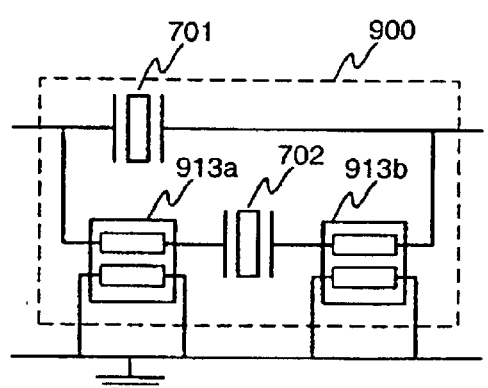

FIG. 10A illustrates as an example of basic half-lattice filter sections, a basic half-lattice filter section having only one series resonator 701 and one shunt resonator 702. FIGS. 10B, 10C and 10D illustrate various examples of phase shifting means applicable in a half-lattice filter section. In FIG. 10B the phase shift is arranged using a transformer 911 having a coupling factor 1:−1. As FIG. 10B illustrates, the other ends of the circuits of the transformer 911 are connected to ground level. In FIG. 10C the phase shift is arranged using a transmission line 912 having a length corresponding to 180 degree phase shift (i.e. half wavelength at the filter section's center frequency). The required phase shift may be realized in two or more steps. FIG. 10D illustrates an example, where a number of phase shifting components are used to provide a total phase shift of substantially 180 degree: two transmission lines 913a,b each provide a phase shift of substantially 45 degrees. A further example of phase shifting means is lumped element phase shifting circuitry having a plurality of capacitors and coils connected properly. Such lumped element phase shifting circuitry is known to a person skilled in the art. The phase shifting elements or components can be realized on a filter chip as monolithic elements or they can also be auxiliary components located off chip. The preferred option is often a monolithic implementation.

Figure 11A:
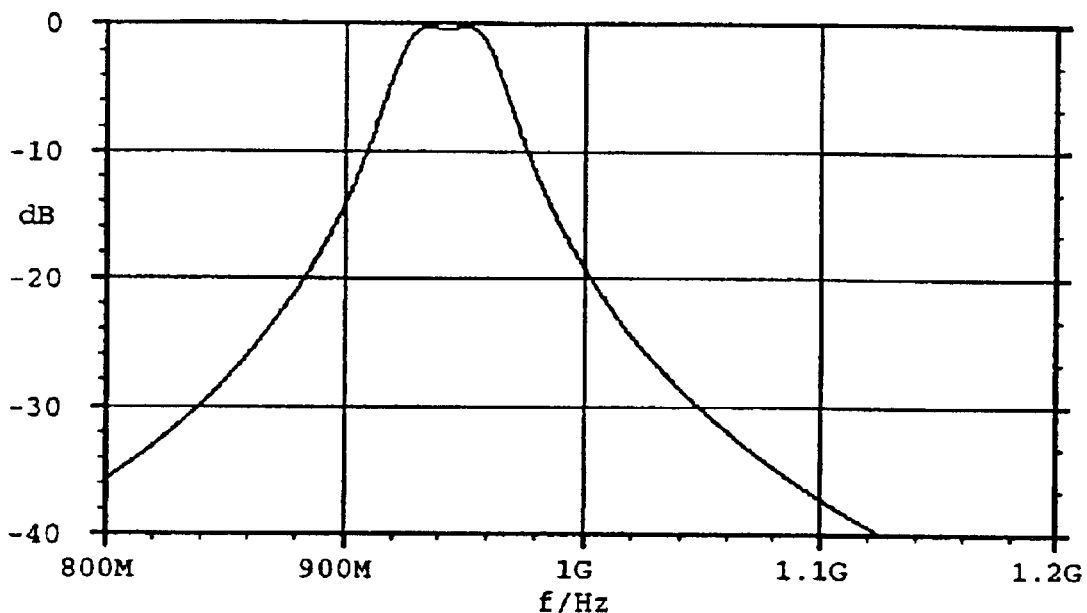
FIG. 11 illustrates an example of the electric response of a basic half-lattice filter section, FIG. 12 compares the electric response of a basic half lattice filter section and that of a three-stage ladder filter.
Figure 11B:
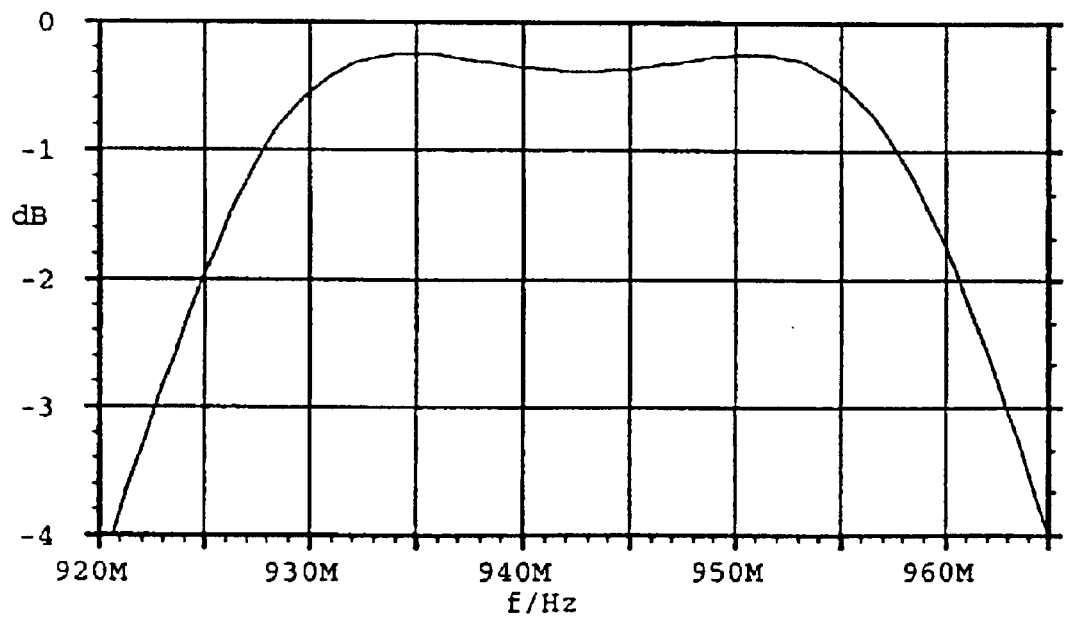

FIGS. 11A and 11B illustrate an example of the electric response of a basic half-lattice filter section presented in FIG. 10A. The electric response is calculated, and the resonance frequencies of the piezoelectric resonators 701 and 702 in the basic half-lattice filter section are identical to those of the piezoelectric resonators 701/801 and 702/802 in filters 700 and 800. Thus $f_{ss}$ is equal to $f_{pp}$ in that basic half lattice filter section, whose calculated electric response is illustrated in FIG. 11. The capacitances (areas) of (BAW) resonators 701 and 702 are equal in the half-lattice filter, whose electric response is illustrated in FIG. 11. The center frequency of the basic half-lattice filter is thus same as presented in FIGS. 7B and 8B. The electric response of a basic half-lattice filter section is similar to that of a lattice filter section (cf FIGS. 8B and 11A). Advantages of the half-lattice filter section are that the number of piezoelectric resonators therein is half of the number of piezoelectric resonators in a simple lattice filter section and the half-lattice filter section is single ended.

Figure 7A:
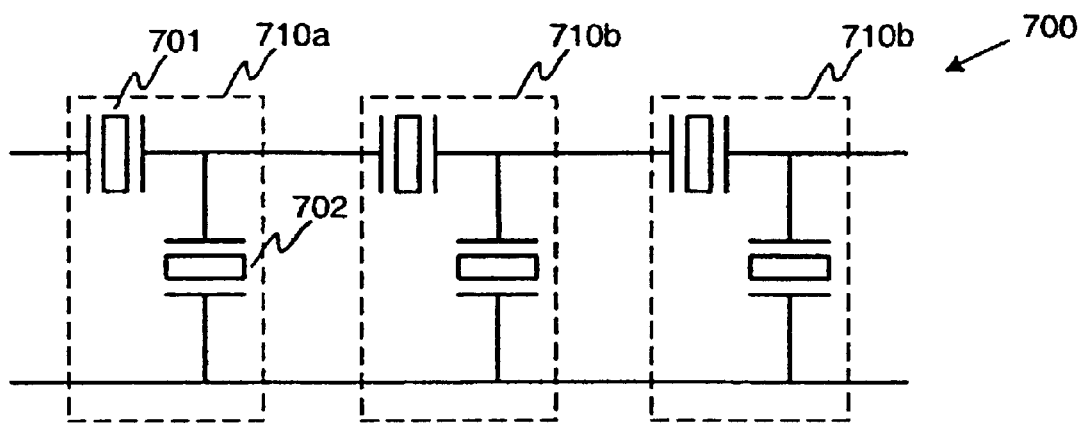
FIG. 7 illustrates an example of a prior art ladder filter structure and its electric response.
Figure 7B:
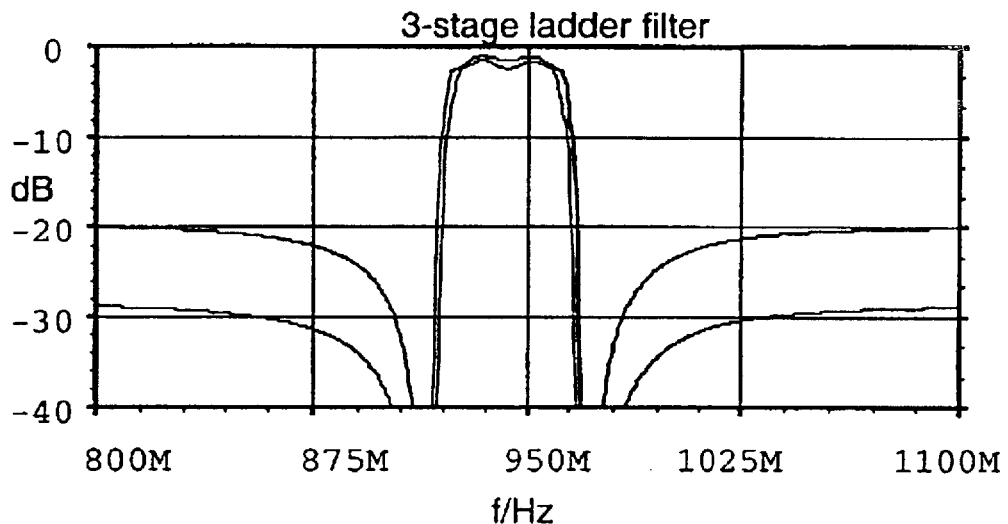
Figure 8B:
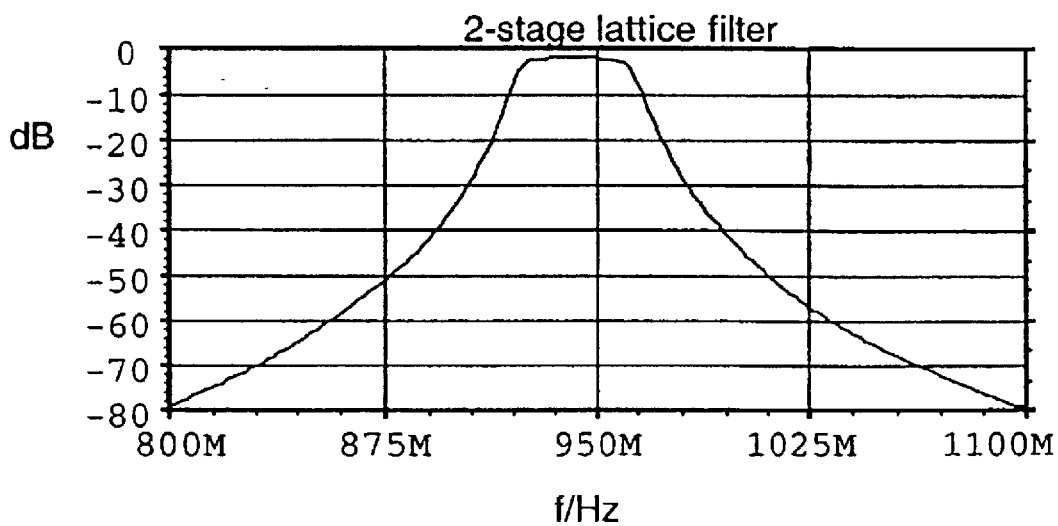

Comparison of FIGS. 7B and 11A reveals that the selectivity of a basic half-lattice filter section is not as good as that of a typical 3-stage ladder filter. The number of elements in a basic half-lattice filter section is, however, less then half of a typical 3-stage ladder filter and the out of band attenuation far from the pass band is clearly superior to that of a ladder filter.

Figure 12A:
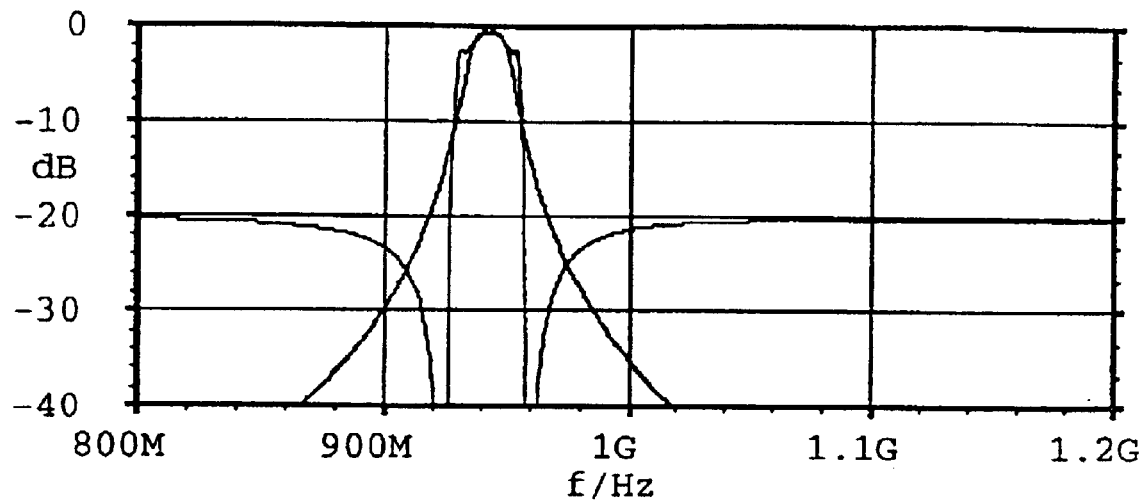
Figure 12B:
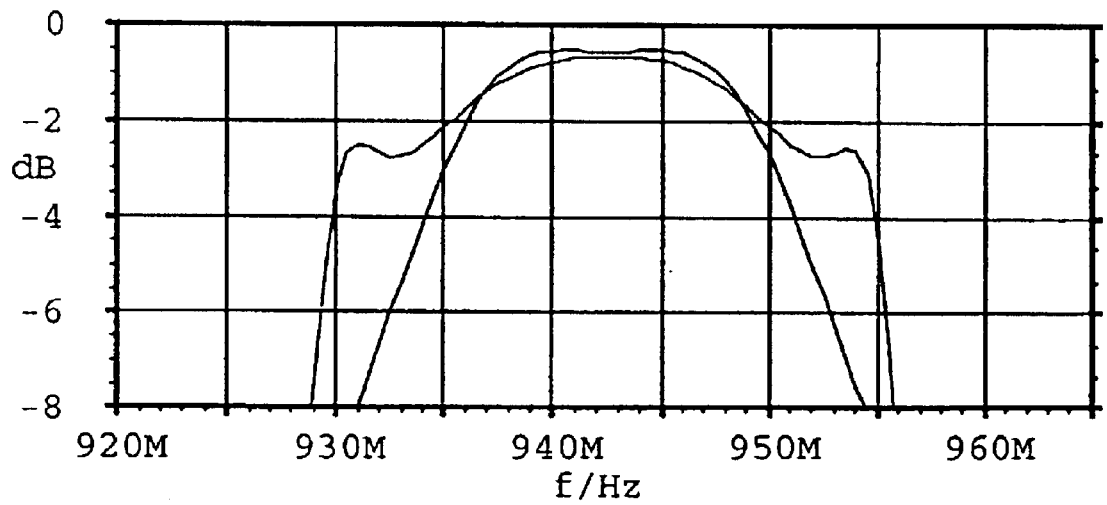

FIG. 12 compares the calculated electric response of a basic half lattice filter section and that of a three-stage ladder filter. Compare first the electric response of this three-stage ladder filter (broader curve in FIG. 12B) to the electric response of another three-stage ladder filter illustrated in FIG. 7B. The pass band illustrated in FIG. 12 is considerably narrower; the width of the pass band at −3 dB is about 40 MHz in FIG. 7B, whereas it is about 25 MHz in FIG. 12B. The numbers, which are given here, are specific for these two three-stage ladder filters. The effect of certain pair of filters and depend, for example, on the details of the filter structures and on the piezoelectric material. The decrease in the width of the pass band is obtained by cross-tuning the frequencies $f_{pp}$ and $f_{ss}$. In the three-stage ladder filter relating to FIG. 7B $f_{ss}$ is close to $f_{pp}$, but in the three-stage ladder filter relating to FIG. 12 $f_{ss}$ is smaller than $f_{pp}$. FIG. 12 illustrates as narrow a pass band as it is practically possible to obtain with a three-stage ladder filter a at center frequency of about 942 MHz. If the resonance frequency $f_{ss}$ is further decreased or $f_{pp}$ is further increased, attenuation of the filter structure increases fast. The values 25 MHz and 40 MHz, which are mentioned above as widths of the pass band, are examples; the effect of cross-tuning on the pass band depends, for example, on the filter structure and on the piezoelectric material.

Consider next the electric response of the basic half-lattice filter illustrated in FIG. 12. As FIG. 12B illustrates, the width of the pass band of the basic half-lattice filter (15 MHz in FIG. 12) is considerably narrower than that of the cross-tuned three-stage filter (25 MHz in FIG. 12). The frequency $f_{pp}$ is higher and the frequency $f_{ss}$ is lower in the basic half-lattice filter relating to FIG. 12 than in the ladder filter relating to FIG. 12. FIG. 12 thus clearly illustrates that a (basic) half-lattice filter section enables design and construction of single-ended filters, which have narrower pass band than ladder filters.

Figure 13:
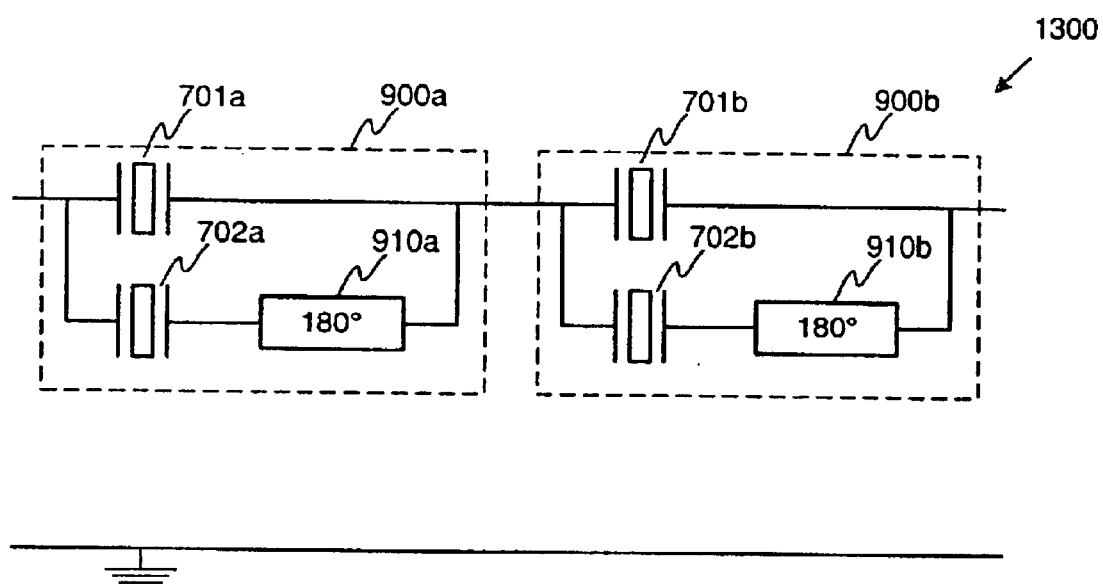
FIG. 13 illustrates an example of a filter structure according to a first preferred embodiment of the invention.

The width of the pass band of a basic half-lattice filter section may be chosen within a quite wide range without increasing attenuation or worsening the shape of the electric response radically. This can be seen from FIGS. 12B and 11B. The selectivity of a filter, which has one half-lattice filter section, close to the pass band may be improved by adding a second stage similar to the first one. FIG. 13 illustrates an example of such a filter structure according to the first preferred embodiment of the invention. The filter structure 1300 has two basic half-lattice filter sections 900a, 900b connected in series.

Figure 14:
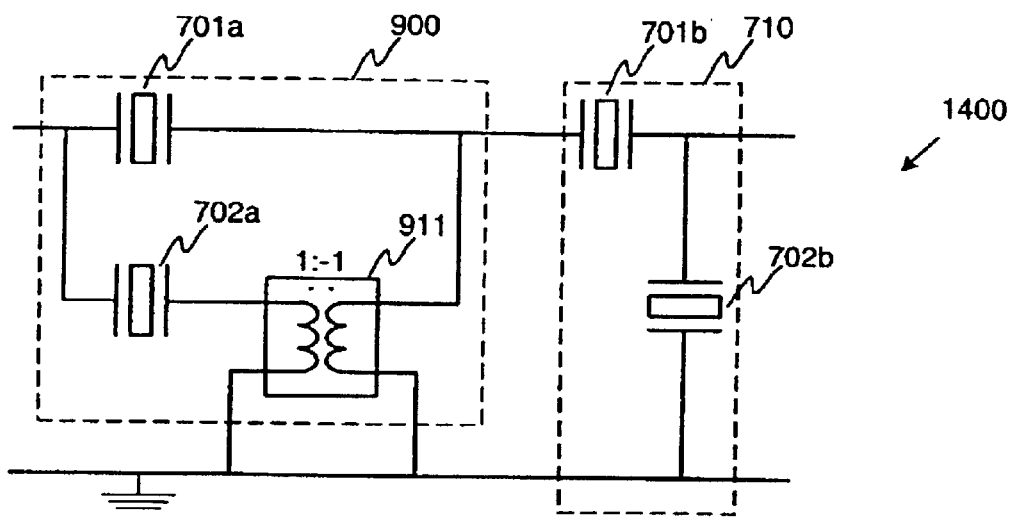
FIG. 14 illustrates an example of a filter structure according to a second preferred embodiment of the invention.

It is, however, even more favorable to combine at least one ladder filter section with a half-lattice filter section. FIG. 14 illustrates, as an example, a filter structure 1400 according to the second preferred embodiment of the invention. This filter structure 1400 has two filter sections: a basic half-lattice filter section 900 and a ladder filter section 710 connected in series. In a filter structure, which is connected for example to an antenna, either one of the filter sections 710, 900 may be connected to the antenna port. The phase shifting means in filter structure 1400 is, as an example, a transformer 911. In filter structure 1400 the resonance frequencies of piezoelectric resonators 701a and 701b are practically identical, similarly as those of piezoelectric resonators 702a and 702b. It is possible that the piezoelectric resonators 701b and 702b in the ladder filter section 700 in filter structure 1300 are replaced with pluralities of piezoelectric resonators connected in series. Similarly, the half-lattice filter section of filter structure 1400 need not be a basic half-lattice filter section.

Figure 15A:
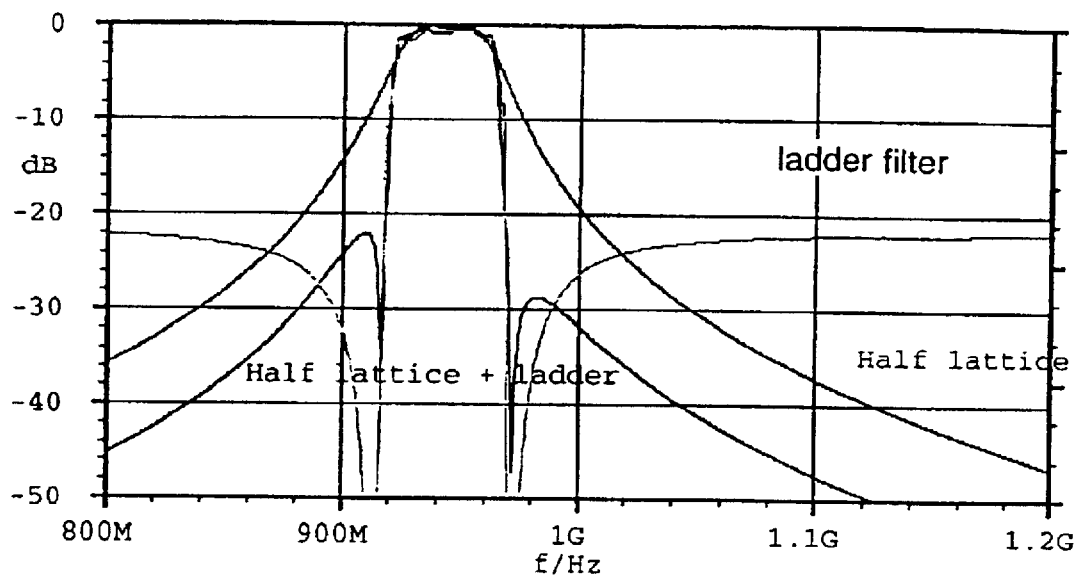
FIG. 15 illustrates electric response a filter structure according to the second preferred embodiment of the invention.
Figure 15B:
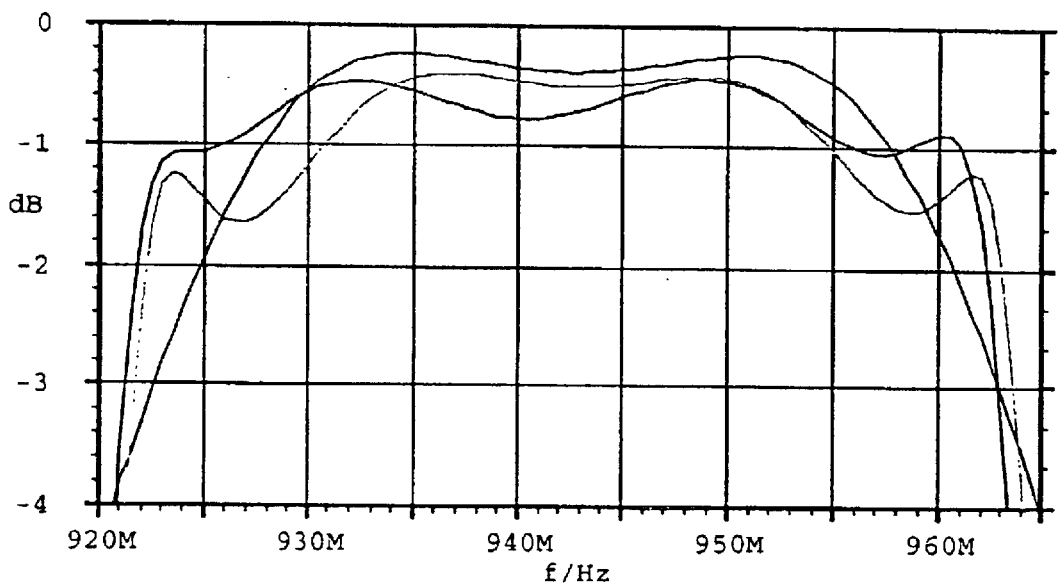

It is possible that the resonance frequencies of series resonators 701 (and those of shunt resonators 702) in a first filter section and in a second filter section of a filter structure are not equal, although the center frequencies of these filter sections are equal. Having different resonance frequencies in the series/parallel resonators of two filter sections may give some advantages in designing the shape of the electric response near the edge of the pass band. If the piezoelectric resonators in the filter structure are thin film BAW resonators, the manufacturing process typically should have some extra steps for enabling the construction of BAW resonators of various thickness. Typically the resonance frequencies of the series resonators 701 in filter sections of a filter structure are equal, similarly as the resonance frequencies of shunt resonators 702. FIGS. 15A and 15B illustrate the electric response a filter structure 1400. In FIGS. 15A and 15B the electric response of a basic half-lattice filter section, that of a ladder filter section and that of the filter structure 1400 are shown. In FIG. 15B the left-most response curve is that of the filter structure 1400 and the right-most response curve is that of a ladder filter section. The response curves in this and other figures of this description are calculated.

FIG. 15 clearly shows that the electric response of a filter structure having at least one half-lattice filter section and at least one ladder filter section connected in series combines the advantages of ladder and lattice filters: it has the good selectivity typical to a ladder filter and the good out-of-band characteristics of a lattice filter. At the pass band the electric responses of these filters are good and, in fact, quite similar as FIG. 15B illustrates. The electric response of the basic half-lattice filter section is the upmost curve in FIG. 15B. The curve having the two dents at frequencies 927 MHz and 958 MHz relates to the ladder filter, and the curve having a dent at 940 MHz is the filter having one half-lattice filter section and one ladder filter section.

FIG. 16 illustrates some examples, where a filter structure comprising a half-lattice filter section may be used. FIG. 16A illustrates a transmitter arrangement 1600. The transmitter arrangement 1600 has a transmitter circuitry 1603, typically having at least a modulator, local oscillator and mixer for combining the signals from the modulator and from the local oscillator; a power amplifier 1602 for amplifying the radio frequency signal to be sent and a filter 1601 for passing frequencies at a desired frequency range or ranges. The filter 1601 has a half-lattice filter section 900 according to the invention. A filter 1601 in a transmitting arrangement may be constructed of BAW resonators. It may be advantageous to use mirror-type BAW resonators, if the heat transfer away from the BAW resonators is crucial. In many applications filter 1601 may have BAW resonators having any structure described above in connection with prior art BAW resonators. The filter 1601 provides an output port for connecting/coupling the transmitter arrangement to an antenna.

Figure 16A:
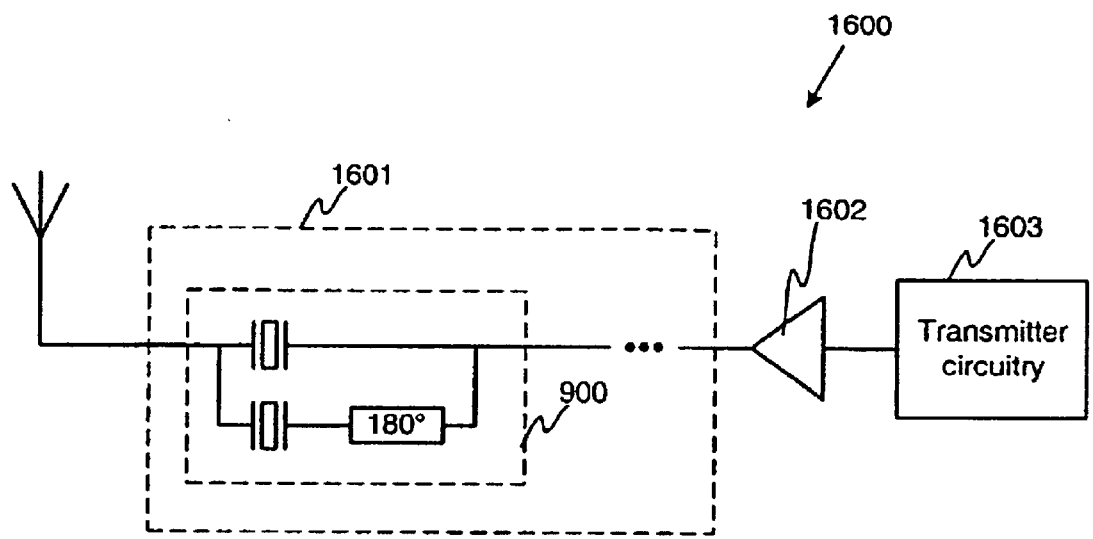
FIG. 16 illustrates a receiver, transmitter and a transceiver arrangement according to the invention.
Figure 16B:
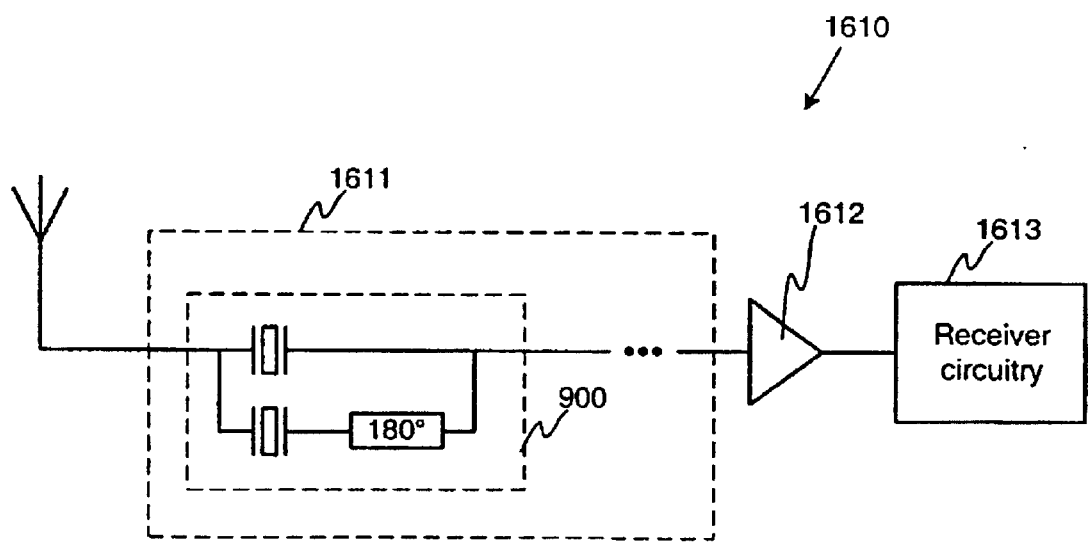

FIG. 16B illustrates a receiver arrangement 1610. The receiver arrangement 1610 has a filter 1611 providing an input port for connecting/coupling an antenna to the receiver arrangement. The filter 1611 has a half-lattice filter section 900 according to the invention and the electric response of the filter is such that frequencies outside desired frequency range(s) are filtered away. The output port of the filter 1611 is connected to a low-noise amplifier 1612, which in turn is connected to suitable receiver circuitry 1613.

The transmitter arrangement 1600 and receiver arrangement 1610 may form part of any radio frequency transmitter or receiver. As an example, a mobile telephone or other portable communications device may have one or both of these arrangements. The half-lattice filter sections in filters 1601 and 1611 need not be basic half-lattice filter sections; they may have a plurality of resonators connected in series instead of one or both of the single series/shunt resonator illustrated in FIGS. 16A and 16B. Furthermore, filters in transmitter and receiver arrangements may be filter structures according to the preferred embodiments of the invention described above.

In many cellular systems, for example, the transmission and reception of a signal occurs at different frequencies. If the transmission occurs at a first frequency band and the reception occurs at a second frequency band, a duplexer is used to separate the transmitted and received signals from each other. The duplexer may be a duplex filter. A duplex filter has two filter branches, and the pass bands of the filter branches are different. A duplex filter connected to an antenna thus allows transmission of signals at first frequency band and reception of signals at a second frequency band. Furthermore, it is possible that transmission and/or reception of signals occurs at various frequency bands, not only using one frequency band. It is possible to design a filter enabling transmission and reception of signals also in this case.

Figure 16C:
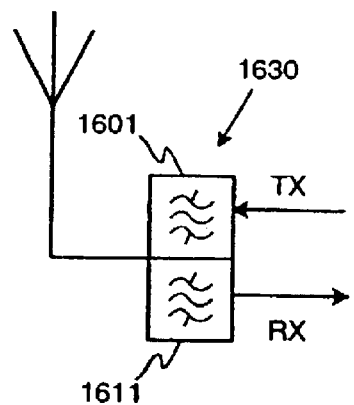

FIG. 16C illustrates schematically a duplex filter structure 1630. This filter structure 1630 is typically used in radio transceivers, and FIG. 16C shows, how it is connected to an antenna. The filter structure 1630 comprises a first filter branch 1601 for filtering signals to be transmitted and a second filter branch 1611 for filtering signals, which are received. The output of the first filter branch 1601 is typically common with the input of the second filter branch 1611, and it is usually called antenna port.

The pass band or pass bands of the first filter branch 1601 is/are different from that/those of the second filter branch 1611, and a filter structure 1630 therefore separates transmitted signals from received ones. The second filter branch appears to have a high reflection coefficient at the transmit frequency and the first filter branch appears to have a high reflection coefficient at the receiving frequency. Usually the filter branches appear to have a high impedance at these frequencies and for example signals to be transmitted, whose frequency band is different from that of received signals, experience the second filter branch 1611 as a high impedance, and do not enter the second filter branch 1611. In cellular systems, the power of a transmitted signal may be, for example, at maximum 2 W. The power of received signals, on the other hand, may be of the order of −100 dBm.

Similarly, a received signal experiences the first filter branch 1601 as a high impedance, and enters the second filter branch 1611. This way practically all the received signal power enters the receiver circuitry.

Figure 16D:
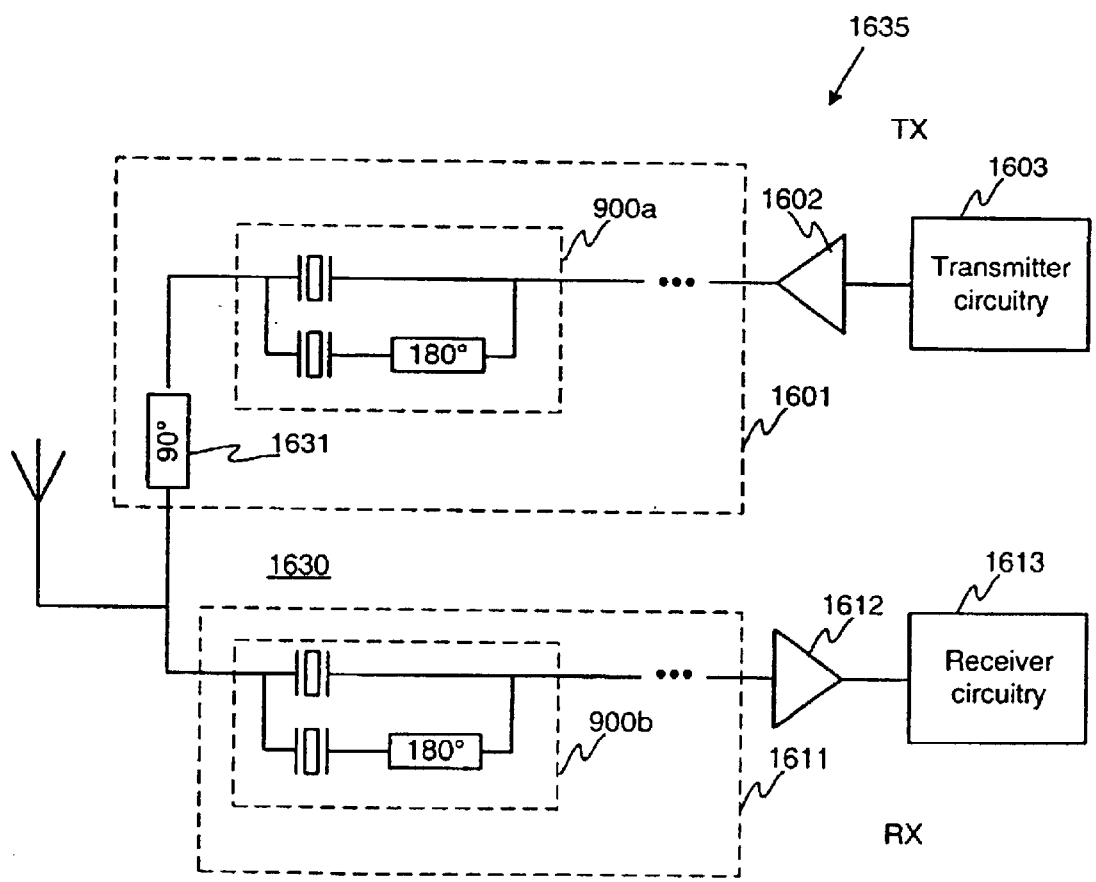

FIG. 16D illustrates as an example a duplex filter 1630 in a transmitter arrangement 1635. The duplex filter 1630 has a first filter branch 1601, where there is a basic half-lattice filter section 900a, and a second filter branch 1611, where there is a basic half-lattice filter section 900b. It is possible that the filter branches 1601, 1611 comprise further filter sections, such a ladder filter sections connected in series with the half-lattice filter sections. Furthermore, the basic half-lattice filter sections illustrated in FIG. 16D may be replaced with half-lattice filter sections having more than one series or shunt piezoelectric resonators connected in series instead of the single piezoelectric resonators illustrated in FIG. 16D. A further possibility is that only one of the filter branches 1601, 1611 comprises a half-lattice filter section, but typically both the receiver and transmitter branch have a half-lattice filter section, if a duplex filter is realized using half-lattice filter sections.

A duplex filter 1630 is preferably realized monolithically by having both filter branches 1601, 1611 as well as the phase shifting means in filter sections 900a, 900b on single chip. This requires an additional layer on the TX resonators (assuming TX frequency is below RX frequency) to shift down the frequency of the TX filter branch. The phase shifting means could be monolithic transformers implemented with integrated passive elements (L and C). There are also a lot of other feasible variations; the package substrate could have for example transmission lines that perform the phase shifting. In some cases it may be desirable to realize the phase shifting with external components. Typically one of the filter branches RX or TX is coupled to the antenna port via phase shifting means 1631 arranged to provide of phase shift of substantially 90 degrees to improve the matching in antenna port. In FIG. 16D this phase shifting means 1631 is, as an example, part of the TX filter branch 1601.

Term bulk acoustic resonator in the accompanying claims and in this description refers to a structure having a piezoelectric layer and a first electrode on one side of said piezoelectric layer and a second electrode on opposite side of said piezoelectric layer. The structure may further have, for example, additional piezoelectric layers and additional electrodes.

Term surface acoustic wave resonator in the accompanying claims and in this description refers to a structure having at least two electrodes on a surface of a piezoelectric material, said piezoelectric material typically being a single piezoelectric crystal.

Term connect and derivatives therefrom in the accompanying claims and in this description refer to galvanic connection. Term couple and derivatives therefrom in the accompanying claims and in this description refer to electrical—not necessarily galvanic—coupling. For example, two components coupled together may be each galvanically connected to an intermediate electrical component.

In view of the foregoing description it will be evident to a person skilled in the art that various modifications may be made within the scope of the invention. While a preferred embodiment of the invention has been described in detail, it should be apparent that many modifications and variations thereto are possible, all of which fall within the true spirit and scope of the invention as defined in the appended claims.

What is claimed is:

1. A filter structure comprising a filter section having at least two branches connected in parallel, first branch of said at least two branches comprising one or more first piezoelectric resonators connected in series, said one or more first piezoelectric resonators having a first resonance frequency, and a second branch of said at least two branches comprising one or more second piezoelectric resonators and phase shifting means connected in series, said phase shifting means arranged to provide a phase shift of substantially 180 degrees and said one or more second piezoelectric resonators having a second resonance frequency, said second resonance frequency being different from the first resonance frequency, wherein each of the first and second piezoelectric resonators includes exactly one piezoelectric layer and two electrodes disposed adjacent to said exactly one piezoelectric layer for providing the corresponding resonance frequency.

2. A filter structure according to claim 1, further comprising, connected in series with said filter section, a second filter section having at least two branches connected in parallel, first branch of said at least two branches comprising one or more third piezoelectric resonators connected in series and a second branch of said at least two branches comprising one or more fourth piezoelectric resonators and phase shifting means connected in series, said phase shifting means arranged to provide a phase shift of substantially 180 degrees.

3. A filter structure according to claim 1, further comprising, connected in series with said filter section, a second filter section having one or more third piezoelectric resonators connected in series with said filter section for providing a signal path and, in parallel with said signal path, one or more fourth piezoelectric resonators connected in series.

4. A filter structure according to claim 1, which is a duplex filter having a receiver filter branch and a transmitter filter branch coupled to a conductor forming a common port for said receiver filter branch and transmitter filter branch, said filter section forming a part of either said receiver filter branch or transmitter filter branch and the passband of said receiver filter branch being different from the passband of said transmitter filter branch.

5. A filter structure according to claim 4, wherein each of the receiver branch and the transmitter filter branch comprises a filter section having at least two branches connected in parallel, first branch of said at least two branches comprising one or more first piezoelectric resonators connected in series and a second branch of said at least two branches comprising one or more second piezoelectric resonators and phase shifting means connected in series, said phase shifting means arranged to provide a phase shift of substantially 180 degrees.

6. A filter structure according to claim 4, further comprising phase shifting means arranged to provide a phase shift of substantially 90 degrees and to connect either the receiver filter branch or the transmitter filter branch to said conductor forming said common port.

7. A filter structure according to claim 1, wherein said phase shifting means consists of one phase shifting element.

8. A filter structure according to claim 7, wherein said phase shifting element is a transformer.

9. A filter structure according to claim 7, wherein said phase shifting element is a substantially half-wavelength long transmission line.

10. A filter structure according to claim 1, wherein said phase shifting means comprises lumped element phase shifting circuitry consisting of capacitors and coils.

11. A filter structure according to claim 1, wherein said phase shifting means comprises a plurality of phase shifting elements, the sum of the phase shift arranged to be provided by said plurality of phase shifting elements being substantially 180 degrees.

12. A filter structure according to claim 11, wherein said plurality of phase shifting elements comprises a plurality of transmission lines.

13. A filter structure according to claim 12, wherein said plurality of transmission lines comprises two substantially quarter-wavelength long transmission lines.

14. A filter structure according to claim 1, wherein the series resonance frequency of said one or more first piezoelectric resonators is substantially equal to the resonance frequency of said one or more second piezoelectric resonators.

15. A filter structure according to claim 2, wherein the series resonance frequency of said one or more third piezoelectric resonators is substantially equal to the resonance frequency of said one or more fourth piezoelectric resonators.

16. A filter structure according to claim 3, wherein the series resonance frequency of one or more third piezoelectric resonators is substantially equal to the resonance frequency of said one or more fourth piezoelectric resonators.

17. A filter structure according to claim 1, wherein said one or more first piezoelectric resonators are bulk acoustic wave resonators.

18. A filter structure according to claim 17, wherein said one or more second piezoelectric resonators are bulk acoustic wave resonators.

19. A filter structure according to claim 1, wherein said one or more first and second piezoelectric resonators are surface acoustic wave resonators.

20. An arrangement for transmitting and receiving radio frequency signal, comprising
first amplification means for amplifying a first signal,
second amplification means for amplifying a second signal, and
a filter structure comprising a first filter branch for filtering the first signal and a second filter branch for filtering the second signal, said first filter branch having a first input conductor and a first output conductor and said second filter branch having a second input conductor and a second output conductor, said first output conductor being connected to said second input conductor, said first input conductor being coupled to an output of the first amplification means and said second output conductor being coupled to an input of the second amplification means,
wherein at least one of said first and second filter branches comprises a filter section having at least two branches connected in parallel, first branch of said at least two branches comprising one or more first piezoelectric resonators connected in series, said one or more first piezoelectric resonators having a first resonance frequency, and a second branch of said at least two branches comprising one or more second piezoelectric resonators and phase shifting means connected in series, said phase shifting means arranged to provide a phase shift of substantially 180 degrees and said one or more piezoelectric resonators having a second resonance frequency, said second resonance frequency being different from the first resonance frequency, and wherein each of said one or more first and second piezoelectric resonators includes exactly one piezoelectric layer and two electrodes disposed adjacent to said exactly one piezoelectric layer for providing the corresponding resonance frequency.

21. An arrangement for transmitting radio frequency signal, comprising a single-ended filter structure providing a port for coupling thereto an antenna, and amplification means connected to said filter structure for amplifying a signal to be transmitted before filtering said signal, wherein said filter structure comprises a filter section having at least two branches connected in parallel, first branch of said at least two branches comprising one or more first piezoelectric resonators connected in series, said one or more first piezoelectric resonators belonging to said first plurality having a first resonance frequency, and a second branch of said at least two branches comprising one or more second piezoelectric resonators and phase shifting means connected in series, said phase shifting means arranged to provide a phase shift of substantially 180 degrees and said one or more second piezoelectric resonators having a second resonance frequency, said second resonance frequency being different from the first resonance frequency, and wherein each of said one or more first and second piezoelectric resonators includes exactly one piezoelectric layer and two electrodes disposed adjacent to said exactly one piezoelectric layer for providing the corresponding resonance frequency.

22. An arrangement for receiving radio frequency signal, comprising a filter structure providing a port for coupling thereto an antenna, and amplification means connected to said filter structure for amplifying a filtered signal, wherein said filter structure comprises a filter section having at least two branches connected in parallel, first branch of said at least two branches comprising one or more first piezoelectric resonators connected in series, said one or more first piezoelectric resonators having a first resonance frequency, and a second branch of said at least two branches comprising one or more second piezoelectric resonators and phase shifting means connected in series, said phase shifting means arranged to provide a phase shift of substantially 180 degrees and said one or more second piezoelectric resonators having a second resonance frequency, said second resonance frequency being different from the first resonance frequency, and wherein each of said one or more first and second piezoelectric resonators includes exactly one piezoelectric layer and two electrodes disposed adjacent to said exactly one piezoelectric layer for providing the corresponding resonance frequency.

* * * * *